US007026177B2

(12) United States Patent
Laprade

(10) Patent No.: US 7,026,177 B2
(45) Date of Patent: Apr. 11, 2006

(54) ELECTRON MULTIPLIER WITH ENHANCED ION CONVERSION

(75) Inventor: Bruce Laprade, Holland, MA (US)

(73) Assignee: Burle Technologies, Inc., Wilmington, DE (US)

( * ) Notice: Subject to any disclaimer, the term of this patent is extended or adjusted under 35 U.S.C. 154(b) by 0 days.

(21) Appl. No.: 10/847,565

(22) Filed: May 17, 2004

(65) Prior Publication Data

US 2004/0206911 A1 Oct. 21, 2004

Related U.S. Application Data

(62) Division of application No. 09/809,090, filed on Mar. 16, 2001, now Pat. No. 6,828,729.

(60) Provisional application No. 60/189,894, filed on Mar. 16, 2000.

(51) Int. Cl.
*H01L 21/00* (2006.01)

(52) U.S. Cl. ................................ 438/20; 313/103 CM

(58) Field of Classification Search .................. 257/10; 438/20; 250/287; 313/103 R, 103 CM, 313/104, 528, 532

See application file for complete search history.

(56) References Cited

U.S. PATENT DOCUMENTS 4,051,403 A * 9/1977 Feingold et al. ...... 313/105 CM
4,267,448 A 5/1981 Feser et al.
4,454,422 A 6/1984 Persyk
4,471,378 A 9/1984 Ng
4,532,171 A * 7/1985 Balkwill ..................... 428/188
4,948,965 A 8/1990 Feller
4,978,885 A 12/1990 White et al.
4,996,422 A 2/1991 Mitsui et al.
5,306,910 A 4/1994 Jarrell et al.
5,349,185 A 9/1994 Mendenhall
5,374,826 A 12/1994 LaRue et al.
5,436,446 A 7/1995 Jarrell et al.
5,463,218 A 10/1995 Holle
5,548,121 A 8/1996 Balmer et al.
5,726,076 A * 3/1998 Tasker et al. ................. 438/20
5,770,858 A 6/1998 Fuchs et al.
5,923,120 A * 7/1999 Suzuki et al. ............... 313/532
5,969,361 A 10/1999 Blavette et al.
5,990,483 A 11/1999 Shariv et al.
5,994,694 A 11/1999 Frank et al.
6,008,491 A 12/1999 Smentkowski et al.
6,013,913 A 1/2000 Hanson
6,040,000 A * 3/2000 Floryan et al. ............... 427/78
6,045,677 A * 4/2000 Beetz et al. .................. 205/50
6,051,831 A 4/2000 Koster
6,215,232 B1 * 4/2001 Johnson et al. ...... 313/103 CM
6,396,049 B1 * 5/2002 Estrera et al. ........ 250/214 VT
6,529,463 B1 3/2003 Goodberlet
6,657,385 B1 12/2003 Tomasetti et al.

* cited by examiner

*Primary Examiner*—Stephen W. Smoot
(74) *Attorney, Agent, or Firm*—Dann, Dorfman, Herrell and Skillman, P.C.

(57) ABSTRACT

A replaceable, electronically-isolated, MCP-based spectrometer detector cartridge with enhanced sensitivity is disclosed. A coating on the MCP that enhances the secondary electron emissivity characteristics of the MCP is selected from aluminum oxide ($Al_2O_3$), magnesium oxide (MgO), tin oxide ($SnO_2$), quartz ($SiO_2$), barium flouride ($BaF_2$), rubidium tin ($Rb_3Sn$), berrylium oxide (BeO), diamond and combinations thereof. A mass detector is electro-optically isolated the from a charge collector with a method of detecting a particle including accelerating the particle with a voltage, converting the particle into a multiplicity of electrons and converting the multiplicity of electrons into a multiplicity of photons. The photons then are converted back into electrons which are summed into a charge pulse. A detector also is provided.

9 Claims, 6 Drawing Sheets

ELECTRON MULTIPLIER WITH ENHANCED ION CONVERSION

CROSS REFERENCE TO RELATED APPLICATION

This application is a division of U.S. Nonprovisional Application No. 09/809,090, filed on Mar. 16, 2001, which claims the benefit of U.S. Provisional Application No. 60/189,894, filed Mar. 16, 2000, now U.S. Pat. No. 6,828, 729.

BACKGROUND OF THE INVENTION

Conventional time-of-flight mass spectrometry (TOFMS) is a technique that uses electron impact (EI) ionization. EI ionization involves irradiating a gas phase molecule of the unknown composition with an electron beam, which displaces outer orbital electrons, thereby producing a net positive charge on the newly formed ion.

TOFMS has seen a resurgence due to the commercial development of two new ionization methods: electrospray ionization (ESI) and matrix-assisted laser desorption/ionization (MALDI). The availability of low cost pulsed extraction electronics, high speed digital oscilloscopes and ultra-high speed microchannel plate detectors have improved the mass resolution capability of the traditional TOFMS technique.

Mass spectrometers include three major components: (1) an ionization source; (2) a mass filter; and (3) a detector. The ionization source ionizes an unknown composition. The mass filter temporally separates the resultant ions so that lighter ions reach the detector before the heavier ions. The detector converts the ions into a charge pulse. The detector ascertains the arrival times of the charge pulses, which correspond to the masses of the ions. Identifying the masses of the ions enables identification of the unknown composition.

Typically, a TOF mass spectrometer also has a digitizer connected to the detector to process the signals.

In the MALDI technique, the analyte of interest is usually mixed in solution with a large excess of light absorbing matrix material. The sample mixture is placed on a mass spectrometer sample plate and illuminated with a pulse of light from a pulsed laser. The matrix material absorbs the laser light, the analyte molecules are desorbed from the sample surface and ionized by one of a number of ionization mechanisms.

In ESI, the analyte of interest is normally dissolved in an acidified solution. This solution is pumped out the end of a metallic capillary tube held at a high potential. This potential causes the evaporation of extremely small droplets that acquire a high positive charge. Through one of a number of mechanisms, these small droplets continue to evaporate until individual molecular ions are evaporated from the droplet surface into the gas phase. These ions then are extracted through a series of ion optics into the source region of the TOFMS.

The mass filter temporally separates ions by accelerating the ions with a bias voltage ranging up to ±30 kV. Since like charges repel, negative ions, for example, experience repulsive forces, thus tend to accelerate from, a negative potential toward a positive or less negative potential. A higher bias voltage will generate stronger repelling forces, thus greater ion acceleration. The repelling force accelerates lighter particles faster than heavier particles. Although smaller voltages foster better temporal separation, larger voltages allow for greater detection efficiency.

Detectors typically convert an ion into many electrons, forming an electron cloud which is more readily discernable. Three conventional types of detectors, or electron multipliers, generally have been used. The first type of electron multiplier is a single channel electron multiplier (SCEM). SCEMs typically are not used in modem TOFMS instruments because SCEMs provide limited dynamic range and temporal resolution, in the order of 20–30 nanoseconds to full width at half maximum (ns FWHM).

The second type of electron multiplier is a discrete dynode electron multiplier (DDEM). DDEMs exhibit good dynamic range, and are used in moderate and low resolution applications because of relatively poor pulse widths, in the order of 6–10 ns FWHM.

The third type of electron multiplier is a microchannel plate (MCP) electron multiplier. MCPs typically have limited dynamic range, in the order of 20 mHz/cm$^2$ of active area. However, MCPs provide the highest temporal resolution, in the order of 650 ps FWHM.

An ideal TOF electron multiplier should exhibit both high temporal resolution and high sensitivity to high-mass ions, as well as a disinclination to saturation.

As the present invention obtains both high temporal resolution and high sensitivity from an MCP-type electron multiplier, the following reviews the general operating characteristics of an MCP.

FIG. 1 shows an MCP 10. MCP 10 typically is constructed from a fused array of drawn glass tubes filled with a solid, acid-etchable core. Each tube is drawn according to conventional fiber-optic techniques to form single fibers called mono-fibers. A number of these mono-fibers then are stacked in a hexagonal array called a multi. The entire assembly is drawn again to form multi-fibers. The multi-fibers then are stacked to form a boule or billet which is fused together at high temperature. The fused billet is sliced on a wafer saw to the required bias angle, edged to size, then ground and polished to an optical finish, defining a glass wafer 15. Glass wafer 15 is chemically processed to remove the solid core material, leaving a honeycomb structure of millions of pores, also known as holes or channels, 20, which extend at an angle 25 relative to the normal flight trajectory of an ion between the surfaces 30 and 32 of MCP 10.

Referring also to FIG. 2, subsequent processing of the interior surface 35 of each channel 20 produces conductive and secondary electron emissive properties. These secondary electron emissive properties cause channel 20 to produce one or more electrons upon absorption or conversion of a particle, such as an ion, impacting surface 35. As a result, each channel 20 functions like an SCEM, having a continuous dynode source which operates relatively independently of surrounding channels 20.

Finally, a thin metal electrode 40, typically constructed from Inconel or Nichrome, is vacuum deposited on the surfaces 30 and 32 of wafer 15, electrically connecting all channels 20 in parallel. Electrodes 40 permit application of a voltage 45 across MCP 10.

MCP 10 receives ions 50 accelerated thereto by an ion-separating voltage 55. Ion 50 enters an input end 60 of channel 20 and strikes interior surface 35 at a point 62. The impact on surface 35 causes the emission of at least one secondary electron 65. Each secondary electron 65 is accelerated by the electrostatic field created by voltage 45 across channel 20 until electron 65 strikes another point (not shown) on interior surface 35. Assuming secondary electrons 65 have accumulated enough energy from the electrostatic field, each impact releases more secondary electrons 70. This process typically occurs ten to twenty times in channel 20, depending upon the design and use thereof, resulting in a significant signal gain or cascade of output electrons 80. For example, channel 20 may generate 50–500 electrons for each ion.

Gain impacts the sensitivity, or ability to detect an ion, of a spectrometer. A spectrometer with a high gain produces many electrons in an electron cloud corresponding to an ion, thus providing a larger target to detect.

To increase the gain of channel 20, or produce a greater amount of electrons for every ion strike, channel 20 must exhibit enhanced secondary emissivity qualities or conversion efficiency. Enhancing the secondary emissivity qualities of channel 20 is a standing goal.

The gain of channel 20 also is a function of the length-to-diameter ratio (l/d) thereof. This allows for considerable reduction in both length and diameter which permits the fabrication of very small arrays of channels 20 in MCP 10.

In conventional TOF mass spectrometers, electron clouds produced at the channel output are driven toward an anode or charge collector, such as a Faraday cup (not shown). The charge collector sums or integrates the electron charges into a charge pulse, which is analyzed by a digitizer. Because lighter ions accelerate faster than the heavier ions, the voltage pulses correspond to the masses of the respective ions. The aggregate of arrival times of the voltage pulses corresponds to the mass spectrum of the ions. The mass spectrum of the ions aids in discerning the composition of the unknown composition.

Detecting the masses of very massive ions requires a high "post acceleration" potential between the ionization source and the MCP. A high post acceleration potential permits sufficient high mass ion conversion efficiency to enable detection of massive ions. However, MCPs cannot withstand excessive voltages thereacross without risk of significant degradation. Accordingly, some MCP-based spectrometers "float" or electronically isolate the anode from the charge collector. To this end, the MCP output voltage is dropped to ground through a voltage divider. Unfortunately, this creates great potential for arcing or short circuiting between the output and the anode, the energy from which could damage or destroy sensitive and expensive spectrometry equipment. Thus, attaining superior temporal range with an MCP-based spectrometer which also has superior dynamic capabilities, or high sensitivity, may come at significant, unpredictable cost.

Another problem with MCP-based detectors is that, over time, MCPs wear and require replacement. Some mass spectrometers are constructed in a manner that does not permit field replacement of the MCPs. Thus, when an MCP requires replacement, the entire spectrometer had to be returned to the manufacturer for refurbishment. This is undesirable in terms of cost and out-of-service time for the instrument.

To overcome this inconvenience, U.S. Pat. No. 5,770,858 ('858 patent) provides a cartridge containing MCPs which may be installed and uninstalled in the field. However, the charge collector of the '858 cartridge is not electro-optically isolated from the high post acceleration potential of the MCP element therein, like the present cartridge.

Ideally, a TOF electron multiplier should be bipolar, or able to detect both negative and positive ions, which are common to chemical compositions. Thus, the TOF electron multiplier should accommodate positive and negative ion acceleration voltages.

What is needed is a replaceable, electronically-isolated, MCP-based spectrometer detector cartridge with enhanced sensitivity.

SUMMARY OF THE INVENTION

The invention overcomes the problems discussed above with a replaceable, electronically-isolated, MCP-based spectrometer detector cartridge with enhanced sensitivity.

The invention eliminates the potential for destruction of expensive spectrometry equipment from high-voltage power surges due to current source, vacuum or other failures by electro-optically isolating the charge collector from the high post-acceleration potential across the detector assembly.

The invention improves the uptime of a TOF mass spectrometry device by providing an easily replaceable, electro-optically isolated MCP cartridge.

The invention improves the sensitivity of an MCP-based spectroscope by providing a coating on the MCP that enhances the secondary electron emissivity characteristics of the MCP selected from magnesium oxide (MgO), tin oxide ($SnO_2$), quartz ($SiO_2$), barium flouride ($BaF_2$), rubidium tin ($Rb_3Sn$), berrylium oxide (BeO), diamond and combinations thereof.

The invention electro-optically isolates the detector from a spectrometer with a method of detecting a particle including accelerating the particle with a voltage, converting the particle into a multiplicity of electrons and converting the multiplicity of electrons into a multiplicity of photons. The photons then are converted back into electrons and summed into a charge pulse.

The invention also electro-optically isolates the detector from a spectrometer with an arrangement including an electron multiplier, for converting a particle into a multiplicity of electrons, and a scintillator, for converting the multiplicity of electrons into a multiplicity of photons.

Other features and advantages of the invention will become apparent upon reference to the following description and drawings.

BRIEF DESCRIPTION OF THE DRAWINGS

The invention is described below in conjunction with the following drawings, throughout which similar reference characters denote corresponding features, wherein.

DETAILED DESCRIPTION OF THE PREFERRED EMBODIMENTS

The invention is a replaceable, electronically-isolated, MCP-based spectrometer detector cartridge with enhanced sensitivity.

Figure 3:
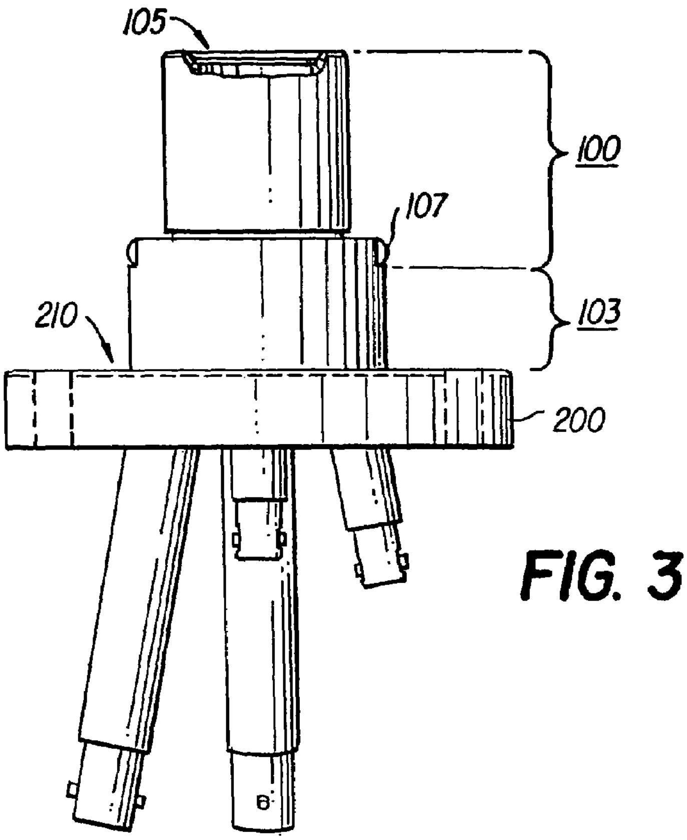
FIG. 3 is a side elevational view of a detector assembly configured according to principles of the invention assembled with a vacuum flange of a mass spectrometer and an interposed shield.
Figure 4:
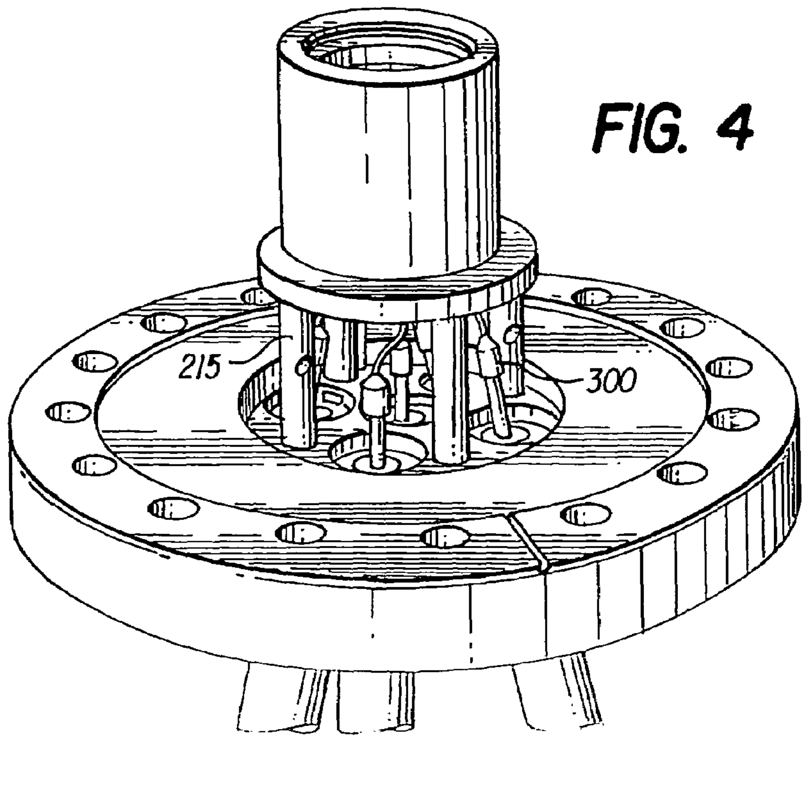
FIG. 4 is an environmental perspective view of the embodiment of FIG. 3, without the interposed shield of FIG. 3.

FIGS. 3 and 4 show a modular detector assembly 100 assembled with a modified vacuum flange 200 of a TOF spectrometer (not shown). FIG. 3 also shows a shield 103 interposed between detector assembly 100 and flange 200. An ionization source (not shown) directs charged or neutral particles, for example, electrons, ions and photons, toward an input end 105 of detector assembly 100.

Detector assembly 100 is adapted to be secured to a vacuum side 210 of vacuum flange 200 with a plurality of rods 215.

A plurality of connectors 300 pass through flange 200. Connectors 300 supply electrical energy to pogo pins (not shown) which contact elements (not shown) for creating electric fields in detector assembly 100 for accelerating particles therein, as discussed below.

Shield 103 is connected to detector assembly 100 with threaded fasteners 107. Shield 103 shields connectors 300 from electromagnetic interference from particles directed toward detector assembly 100 during detection.

Figure 5:
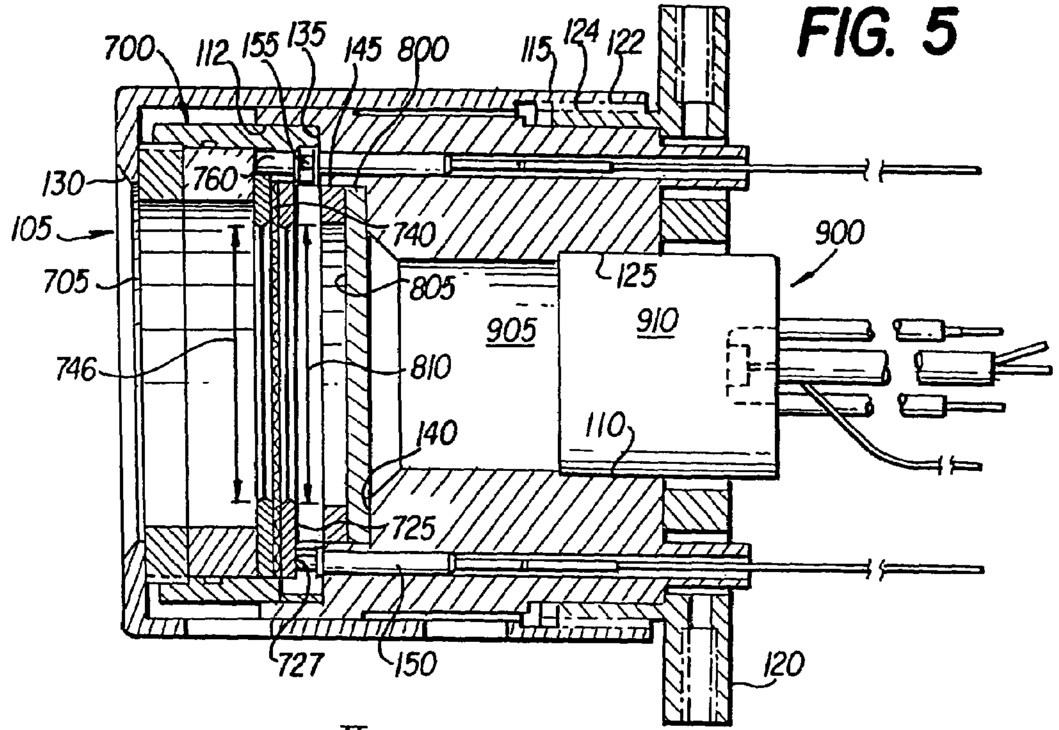
FIG. 5 is a cross-sectional view, drawn along line V—V in FIG. 6, of the detector assembly of FIG. 3.
Figure 6:
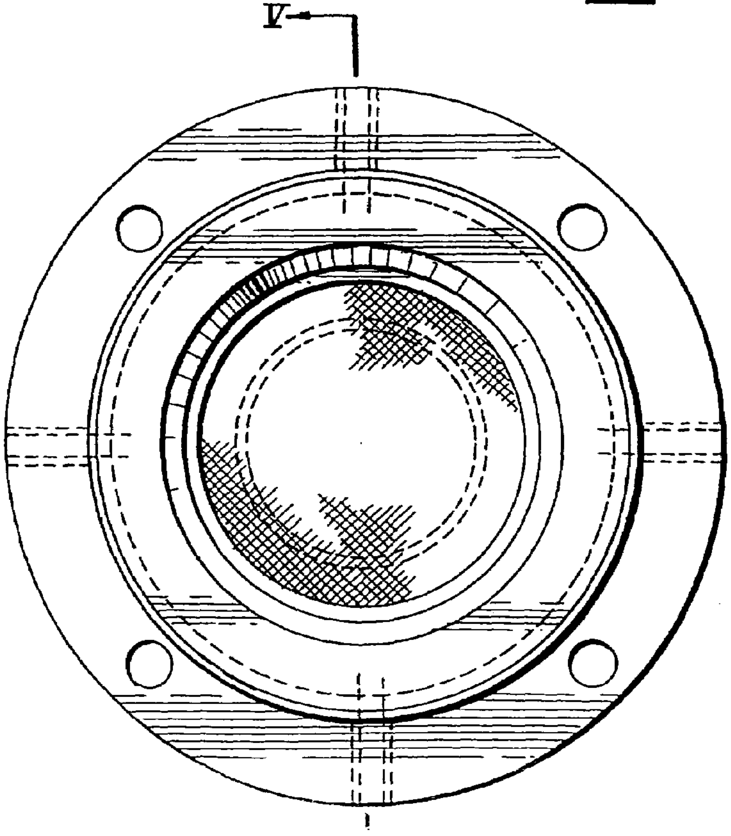
FIGS. 6 and 7 respectively are front and rear elevational views of the detector assembly of FIG. 3.
Figure 7:
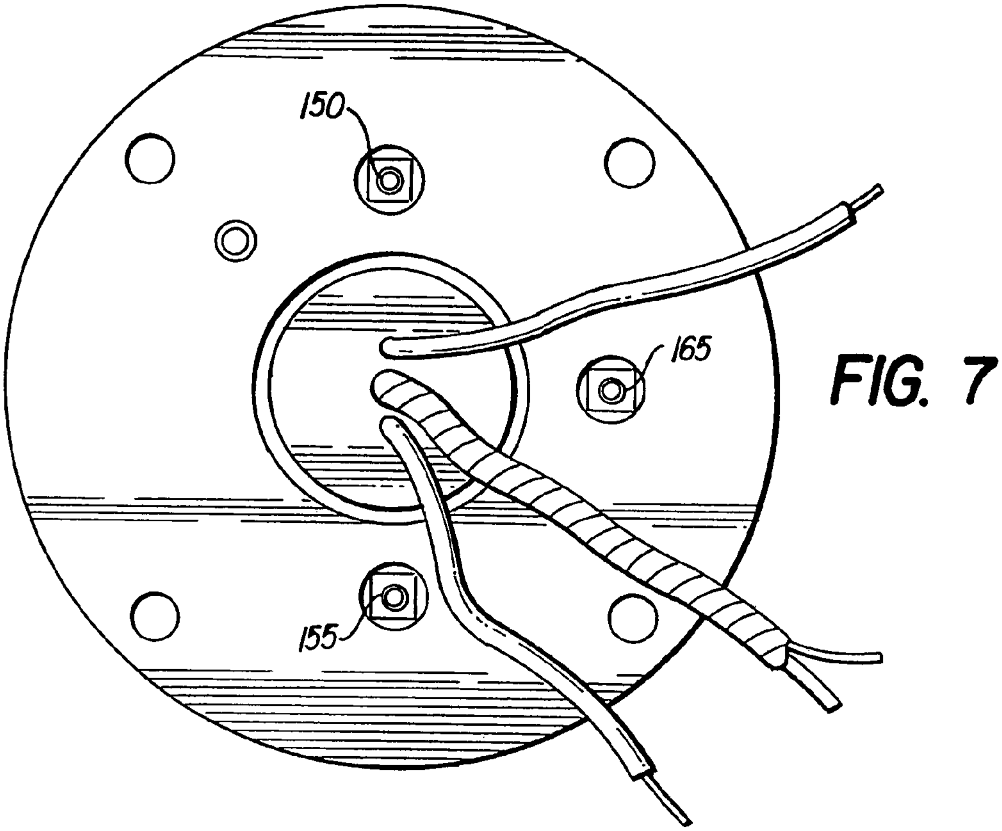

Referring to FIGS. 5–7, detector assembly 100 includes a detector cartridge 700, a scintillator 800 and a charge collector 900. Detector cartridge 700 receives the ions which enter input end 105 from an ionization source (not shown) and produces electrons at intervals that correspond to the respective masses of the ions, as described above. Scintillator 800 receives output electrons from detector cartridge 700 and produces approximately 400 output photons for every electron absorbed. Collector 900 receives and converts the output photons into up to $5\times10^6$ electrons and sums the electrons into a charge pulse. As discussed above, the timing of the pulses correspond to the masses of the ions, thereby aiding identification of an unknown composition.

Detector assembly 100 includes a base 110, a cap 115 and a collector mounting plate 120 which cooperate to receive and support detector cartridge 700, scintillator 800 and collector 900 in a spaced relationship with.

Base 110 has a stepped and tapered central opening 112 for receiving cartridge 700. Base 110 also has a stepped and tapered central opening 125 for receiving collector 900. Collector mounting plate 120 has threads 122 which threadingly engage corresponding threads 124 of cap 115, which facilitates assembling cartridge 700, scintillator 800 and collector 900 within detector assembly 100.

Base 110 has a shoulder 135 that receives and maintains cartridge 700 in spaced relationship with respect to collector 900. Base 110 has a second shoulder 140 that receives scintillator 800. Base 110 maintains scintillator 800 in spaced relationship with respect to collector 900. A ring 145 maintains scintillator 800 against shoulder 140 and imparts a spaced relationship between scintillator 800 and cartridge 700.

Figure 1:
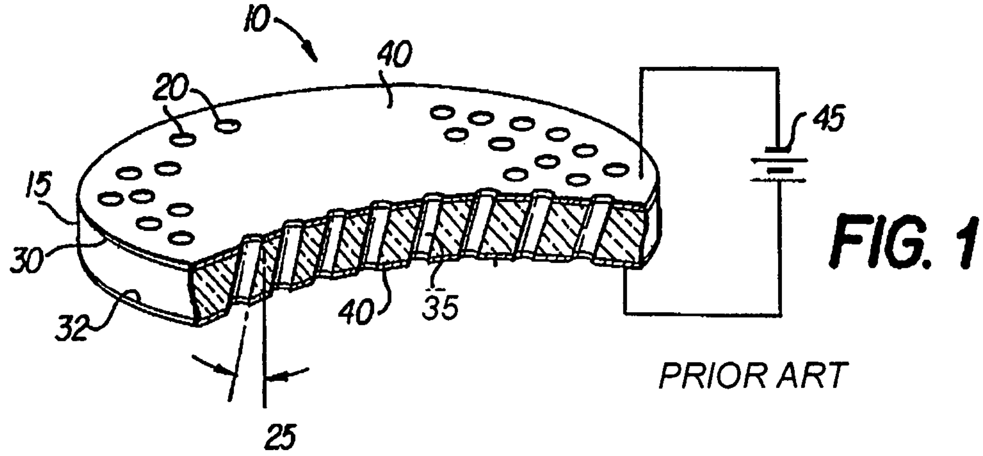
FIG. 1 PRIOR ART
FIG. 1 is a perspective view, partially in section, of a multichannel plate.
Figure 2:
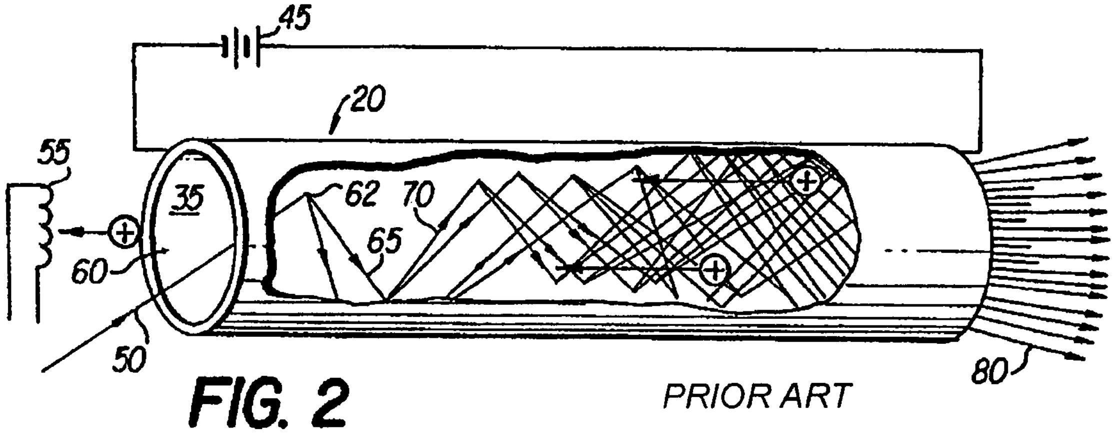
FIG. 2 PRIOR ART
FIG. 2 is a schematic view of a single channel of the multichannel plate of FIG. 1.
Figure 10A:
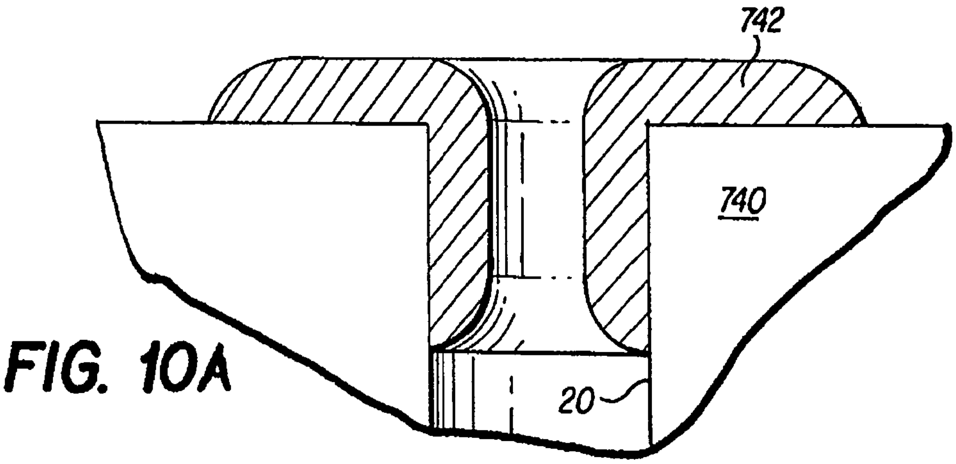
FIG. 10A is a fragmentary schematic view of a channel input having a coating, in accordance with the invention.
Figure 9:
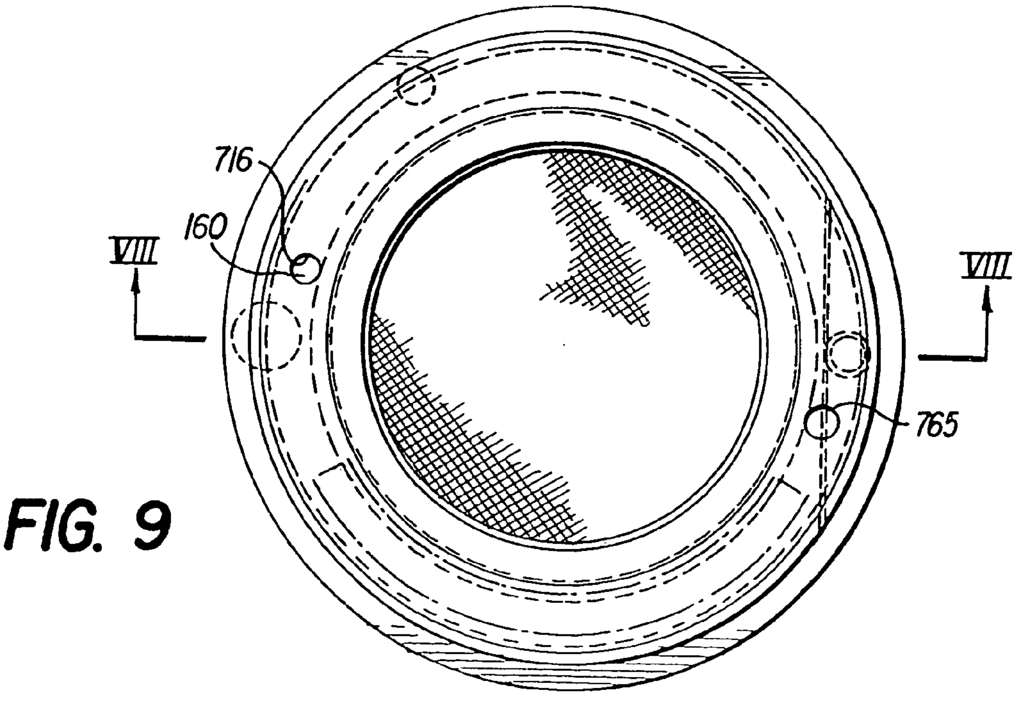
FIG. 9 is a front elevational view of the cartridge of FIG. 5.
Figure 8:
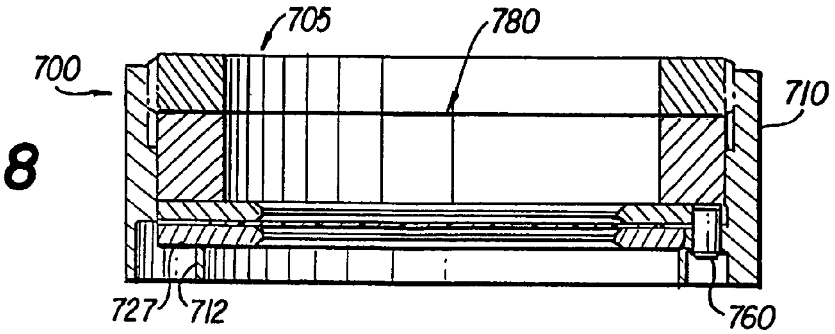
FIG. 8 is a cross-sectional view, drawn along line VIII—VIII in FIG. 9, of the detector cartridge of FIG. 5.
Figure 10:
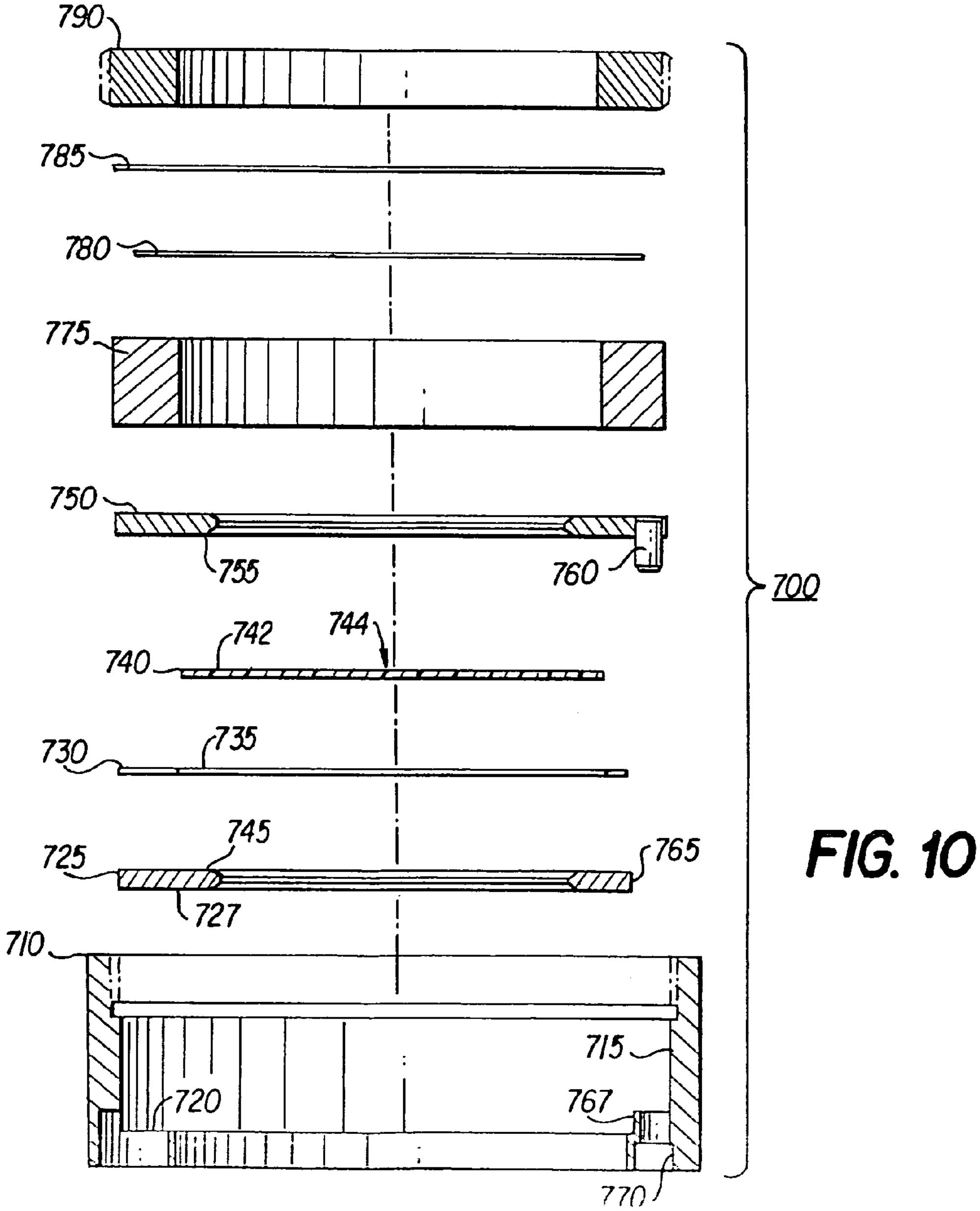
FIG. 10 is an exploded, axial cross-sectional view of the cartridge of FIG. 5.

Referring also to FIGS. 8–10, cartridge 700 has an input 705 through which ions enter cartridge 700 from opening 130 in cap 115, as shown in FIG. 5. Cartridge 700 includes an insulated cartridge body 710 having an interior chamber 715. Cartridge body 710 has an interior shoulder 720 which supports a conductive output plate 725. Output plate 725 is generally circular and has an edge portion 765 removed for providing clearance for an opening 767 in cartridge body 710. An insulating centering ring 730, having a central opening 735, rests on output plate 725. Centering ring 730 receives and centers an MCP 740, which rests on an inner annular edge 745 of output plate 725. A conductive input plate 750 sandwiches centering ring 730 against output plate 725. An inner annular edge 755 of input plate 750 sandwiches MCP 740 against inner annular edge 745. An insulated spacer 775 rests on input plate 750.

A conductive grid or mesh 780 rests on insulated spacer 775. Grid 780 includes crossed wires (not shown) which define a grounded plane for MCP 740. A voltage between grid 780 and the input of MCP 740 defines a “post acceleration” potential which urges ions toward and into MCP 740.

A ring 785 rests on grid 780. An insulating ring retainer 790 threadingly engages with cartridge body 710 and compresses ring 785, grid 780, spacer 775, input plate 750, MCP 740 and output plate 725 against shoulder 720, as shown in FIG. 7. Ring 785 protects grid 780 from damage which might occur if insulating ring retainer 790 is threadingly advanced directly against grid 780.

As shown in FIG. 8, cartridge body 710 has a first contact opening 712 in registration with a contact surface 727 of output plate 725. A contact member 760 extending from input plate 750 passes through a second contact opening 770 of cartridge body 710. As shown in FIG. 5, pogo pin assemblies 150 and 155 respectively contact contact surface 727 and contact member 760, producing a voltage across input plate 750 and output plate 725, hence across MCP 740.

Referring also to FIG. 9, base 110 of detector assembly 100 has upstanding registration pins 160 which mate with corresponding apertures 716 in cartridge body 710 for ensuring that the appropriate pogo pin assemblies 150, 155 contact the appropriate contact surface 727 or contact member 760. This ensures proper voltage polarity upon replacement of cartridge 700. Cartridge 700 is easily replaceable, which reduces the downtime of dependent mass spectrometry equipment.

To provide a high post acceleration potential and safeguard mass spectrometry equipment from voltage surges, the invention employs scintillator 800 to electro-optically isolate collector 900 from upstream voltages. Scintillator 800 converts electrons received from MCP 740 into photons, on the order of 400 photons per electron. The photons cross a neutral field to collector 900, which converts the photons into electrons which are summed into a charge pulse.

Referring again to FIG. 5, scintillator 800 is constructed from either of specially-formulated plastics, known as Bicron 418 and Bicron 422b, manufactured by Bicron, Inc. These materials provide the previously unattainable bandwidth capability necessary for converting the electron clouds produced by MCP 740 within the typical range of frequencies encountered during mass spectrometry of very massive ions. This bandwidth extends up to about 3 GHz.

Scintillator 800 has an input working area 810 defined by ring 145. Upstream of scintillator 800, MCP 740 has an active area 746 defined by the channel array. Working areas 746 and 810 generally are coextensive. Additionally, the voltage between MCP 740 and the input of scintillator 800 accelerates the electrons from MCP 740 toward scintillator 800.

Referring to FIG. 7, pogo pin 165 applies a voltage to an input side of scintillator 800 which provides the uniform field for drawing electrons from MCP 740. The output of scintillator 800 is grounded. Thus, collector 900 is electrically isolated from scintillator 800, preventing arcing or voltage surges from being transferred to expensive instrumentation coupled to detector assembly 100.

The input side of scintillator 800 has a layer 805 of aluminum, in the order of 1000 Å, deposited thereon. Layer 805 also may be chrome. Metalized layer 805 provides a field plane for attracting electrons to scintillator 800. Metalized layer 805 also fosters converting electrons just under the surface thereof into photons.

Layer 805 also functions as a mirror to reflect photons which may have a rearward or wayward trajectory toward collector 900. The reflective properties of layer 805 approximately double electron-to-photon conversion capability of scintillator 800, thus making practical the use of scintillator 800 for electro-optically isolating high post-acceleration voltages across detector assembly 100 from collector 900, promoting high sensitivity to massive ions.

Referring again to FIG. 5, collector 900 includes a photomultiplier 905 which, responsive to the output photons of scintillator 800, generates on the order of $5\times10^6$ electrons for every photon that strikes photomultiplier 905. Collector 900 also includes a socket 910 into which photomultiplier is received. Photomultiplier 905 and socket 910 are electrically connected with pins (not shown) extending from photomultiplier 905 and received in electrical contacts (not shown) in socket 910 in a known manner.

An exemplary photomultiplier 905 is a Hamamatsu RU7400 photomultiplier tube, which is a "fast" photomultiplier. "Fast" refers to the reaction time from when a photon strikes a dynode to when a resultant electron strikes an anode of the photomultiplier. For example, the RU7400 has a reaction time of approximately 3.2 ns FWHM. Faster reaction times improve the dynamic range of a detector because the detector may identify individual ions, rather than groups of ions. Faster reaction times may be possible by connecting one or more downstream dynodes with the anode.

Referring to FIG. 10A, the invention provides improved MCP sensitivity by depositing on the surface 744 of MCP 740 a coating 742. Coating 742 also extends into each channel 20 of MCP 740. Coating 742 enhances the first strike conversion capability, or ability to convert ions into electrons, of MCP 740. An exemplary coating 742 is magnesium oxide (MgO). Magnesium oxide has been found to provide superior secondary electron emissivity properties over other coatings, such as aluminum oxide. Coating 742 also may be tin oxide ($SnO_2$), quartz ($SiO_2$), barium flouride ($BaF_2$), rubidium tin ($Rb_3Sn$), berrylium oxide (BeO) or diamond.

Figure 11:
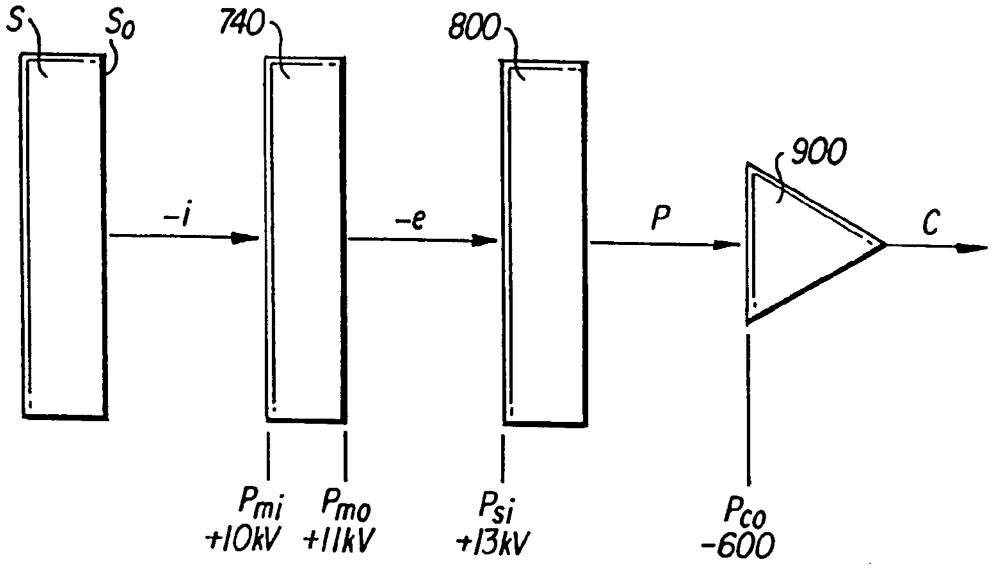
FIGS. 11 and 12 are schematic views of alternative voltages across a mass spectrometer incorporating the detector assembly of FIG. 3.

Referring to FIG. 11, in operation, detector assembly 100 may be used to detect, for example, large negative ions. Ionization source S has multiple plates (not shown) across which a voltage repels only negative ions −i into the field free drift tube. A net +10 kV voltage exists across the gap between ionization source S and MCP 740, between ionization source output $S_o$, which is at ground, and MCP input voltage $P_{mi}$. Ions −i are attracted to MCP 740 by the net positive voltage bias with respect to MCP 740. The voltage between ionization source S and MCP 740 temporally separates negative ions −i by mass. Ions −i may be post-accelerated with a high voltage to increase overall ion detection efficiency.

A net positive potential, such as +1 kV, across MCP 740, i.e. between MCP input ($P_{mi}$=+10 kV) and MCP output ($P_{mo}$=+11 kV), accelerates electrons −e, converted from ions −i, as discussed above, through MCP 740. A net positive voltage, such as +2 kV, between MCP 740 and scintillator 800, i.e. between MCP output ($P_{mo}$=+11 kV) and scintillator input ($P_{si}$=+13 kV), accelerates electrons −e from MCP 740 toward scintillator 800.

Scintillator 800 converts electrons −e into photons P. Photons P are insensitive to electrical fields, therefore the voltage across scintillator 800 may drop to ground. Photons P strike collector 900.

The photomultiplier (not shown in FIG. 11, but see FIG. 5) of collector 900 converts photons P into electrons (not shown). A net positive voltage across collector 900, such as +600 kV, from collector input ($P_{co}$=−600 kV) to the grounded output, urges electrons through collector 900. The electrons are summed into a charge pulse at the output C.

Figure 12:
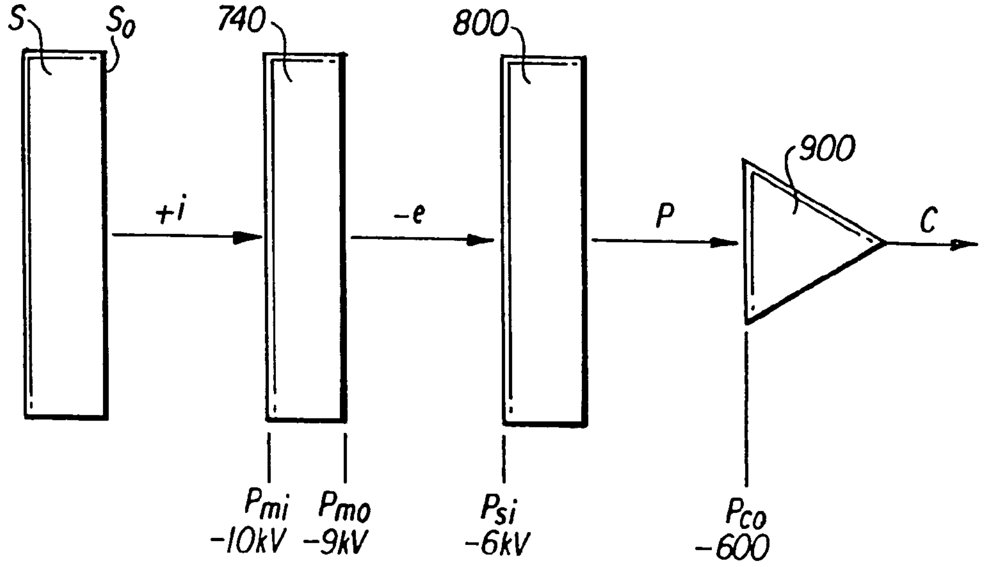

Referring to FIG. 12, detector assembly 100 is bi-polar in that detector assembly 100 may be operated to detect large positive ions as well as negative ions. Similar to the above, ionization source S directs only positive ions +i toward MCP 740. A net −10 kV voltage between ionization source S and MCP 740, i.e. between ionization source output $S_o$ and MCP input voltage $P_{mi}$. Ions +i are attracted to MCP 740 by the net negative voltage bias with respect to MCP 740.

A net positive potential, such as +1 kV, across MCP 740, between MCP input voltage $P_{mi}$ (e.g. −10 kV) and MCP output voltage $P_{mo}$ (e.g. −9 kV), likewise accelerates electrons −e through MCP 740.

Electrons −e from MCP 740 travel toward scintillator 800, driven by a net positive voltage, such as +3 kV, between MCP 740 and scintillator 800, i.e. between MCP output ($P_{mo}$=9 kV) and scintillator input ($P_{si}$=6 kV).

Scintillator 800 converts electrons −e into photons P. The output of scintillator 800 is grounded.

Photomultiplier (not shown in FIG. 12, but see FIG. 5) in collector 900 converts photons P into electrons (not shown), which are urged therethrough with a net +600 kV voltage and summed into a charge pulse at output C.

While the foregoing is considered to be exemplary of the invention, various changes and modifications of feature of the invention may be made without departing from the invention. The appended claims cover such changes and modifications as fall within the true spirit and scope of the invention.

We Claim:

1. A method of converting a charged particle (ion) into a plurality of electrons comprising the steps of:

providing a microchannel plate;

depositing a coating on an input surface of the microchannel plate such that the coating contacts each of a plurality of channels formed in said microchannel plate, said coating being formed of a material that provides enhanced conversion of an ion into electrons by the microchannel plate;

providing an electrical potential across said microchannel plate; and then accelerating a charged particle toward the input surface of the microchannel plate.

2. A method as set forth in claim 1 wherein the step of depositing the coating comprises the step of depositing a material selected from the group consisting of aluminum oxide ($Al_2O_3$), magnesium oxide (MgO), tin oxide ($SnO_2$), quartz ($SiO_2$), barium fluoride ($BaF_2$), rubidium tin ($Rb_3Sn$), beryllium oxide (BeO), diamond, and combinations thereof as the coating.

3. A method as set forth in claim 1 further comprising the steps of forming a first thin metal electrode on the input surface of said microchannel plate and forming a second thin metal electrode on an output surface of said microchannel plate, said metal electrodes being formed before the step of depositing the coating on the input surface of the micro channel plate.

4. A method as set forth in claim 3 wherein the first and second metal electrodes are formed of an INCONEL brand alloy or a NICHROME brand alloy.

5. A method as set forth in claim 3 wherein the step of forming the first thin metal electrode comprises the step of vacuum depositing the first thin metal electrode on the input surface and the step of forming the second metal electrode comprises the step of vacuum depositing the second thin metal electrode on the output surface.

6. A method as set forth in claim 1 wherein the step of depositing the coating comprises the step of applying the coating such that it extends into each of the plurality of channels formed in said microchannel plate.

7. A method as set forth in claim 6 wherein the step of depositing the coating comprises the step of applying the coating such that it extends into each channel to a depth sufficient to increase a first strike conversion capability to convert an ion to electrons.

8. A method as set forth in claim 1 wherein the step of providing the microchannel plate comprises the steps of:

forming a glass wafer having a plurality of channels extending from a first surface of the glass wafer to an output surface thereof, each of said channels having a channel surface; and processing the channel surfaces to provide conductive and secondary electron emissive properties.

9. A method as set forth in claim 8 wherein the step of forming the glass wafer comprises the step of forming each of the plurality of channels to extend at an angle relative to a normal flight trajectory of an ion between the input surface and the output surface.

* * * * *